(12) United States Patent
Witvrouw et al.

(10) Patent No.: US 9,278,848 B2
(45) Date of Patent: Mar. 8, 2016

(54) VERTICAL ELECTROMECHANICAL SWITCH DEVICE

(71) Applicants: IMEC, Leuven (BE); Katholieke Universiteit Leuven, Leuven (BE)

(72) Inventors: Ann Witvrouw, Herent (BE); Maliheh Ramezani, Leuven (BE); Stefan Cosemans, Mol (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 14/133,410

(22) Filed: Dec. 18, 2013

(65) Prior Publication Data
US 2014/0225167 A1      Aug. 14, 2014

(30) Foreign Application Priority Data
Dec. 19, 2012   (EP) ..................................... 12198127

(51) Int. Cl.
| | | |
|---|---|---|
| H01L 29/84 | (2006.01) | |
| B81B 3/00 | (2006.01) | |
| H01H 1/00 | (2006.01) | |
| H01H 59/00 | (2006.01) | |
| B81C 1/00 | (2006.01) | |

(52) U.S. Cl.
CPC ............. *B81B 3/0021* (2013.01); *B81C 1/0015* (2013.01); *H01H 1/0036* (2013.01); *H01H 1/0094* (2013.01); *H01H 59/0009* (2013.01)

(58) Field of Classification Search
CPC .................................................. H01H 1/0094
USPC ....................................................... 257/254
See application file for complete search history.

(56) References Cited

U.S. PATENT DOCUMENTS

| | | | |
|---|---|---|---|
| 2010/0061143 A1* | 3/2010 | Carley ......................... | 365/154 |
| 2012/0138437 A1* | 6/2012 | Ng et al. ...................... | 200/181 |

OTHER PUBLICATIONS

Jang et al., "Nanoscale memory cell based on a nanoelectromechanical switched capacitor," Nature Nanotechnology vol. 3, Jan. 2008, pp. 26-30.

(Continued)

*Primary Examiner* — Marc Armand
*Assistant Examiner* — Tifney Skyles
(74) *Attorney, Agent, or Firm* — Knobbe, Martens, Olson & Bear LLP

(57) ABSTRACT

The disclosed technology relates generally to electromechanical devices, and relates more specifically to a nanoelectromechanical switch device and a method for manufacturing the same. In one aspect, an electromechanical device includes a first electrode stack and a second electrode stack, both electrode stacks extending in a vertical direction relative to a substrate surface and being spaced apart by a gap. The electromechanical device additionally includes a third electrode stack comprising a beam extending in a vertical direction in the electrode gap and being spaced apart from the first electrode stack by a first gap, from the second electrode stack by a second gap, and from the substrate by a third gap; and a connector portion overlapping the first and second electrode stacks, wherein, in operation, the beam is movable in a first direction so as to electrically connect with the first electrode stack or in a second direction so as to electrically connect with the second electrode stack, and, in a rest position, the beam is isolated from the first and the second electrode stacks. Additionally, at least one of the first or second electrode stacks comprises two electrodes including a top electrode stacked over a bottom electrode, wherein the top and bottom electrodes are separated by an electrical insulator.

7 Claims, 9 Drawing Sheets

(56) References Cited

OTHER PUBLICATIONS

Leong et al., "Vertical Silicon Nano-Pillar for Non-Volatile Memory," IEEE, Transducers'11, Jun. 5-9, 2011, Beijing, China, pp. 649-652.

Ng et al., "High density vertical silicon NEM switches with CMOS-compatible fabrication," Electronics Letters, Jun. 23, 2011, vol. 47, No. 13, 2 pages.

Rubin et al., "A Single Lithography Vertical NEMS Switch," IEEE, MEMS 2011, Jan. 23-27, 2011, Cancun, Mexico, pp. 95-98.

* cited by examiner

A10 L3 CO

B10 CO F

A11 CO

B11 CO L2 F

A12 CO

B12 CO F

VERTICAL ELECTROMECHANICAL SWITCH DEVICE

CROSS-REFERENCE TO RELATED APPLICATIONS

This application claims foreign priority to European patent application EP 12198127.8 filed on Dec. 19, 2012, the contents of which is incorporated by reference herein in its entirety.

BACKGROUND OF THE INVENTION

1. Field of the Invention

The disclosed technology relates generally to electromechanical devices, and relates more specifically to a nanoelectromechanical switch device and a method for manufacturing the same.

2. Description of the Related Technology

Nanoelectromechanical systems, as generally understood in the industry, are microelectromechanical systems (MEMS) scaled down to sub-micron feature sizes. Nanoelectromechanical devices in the sub-micron size regime can have some device characteristics not that may not be attainable in MEMS, owing to, for example, the high surface-to-volume ratio and ultralow active masses (e.g., in the femtogram range). One category of such devices, nanoelectromechanical switches (NEMS) can offer an alternative transistors in logic or memory applications. In some aspects, NEMS may offer several advantageous device characteristics compared to transistors. For example, NEMS may offer higher Ion/Ioff ratios compared to transistors with practically no leakage in the off state. On the other hand, some NEMS devices may have some drawbacks such as, for example, their relatively large footprints. For example, NEMS devices, whose switching is based on beam connectors that run in a horizontal direction relative to the substrate surface, can have significantly larger footprint in comparison to transistors fabricated with similar design considerations. There have been proposals for vertical electromechanical switch devices in which the electrodes and connector follow a vertical arrangement relative to the substrate, for example in US patent application 2008/0035928 A1, as an attempt to try to mitigate the relatively large footprints of NEMS. These state of the art proposals however still present additional connection problems that need to be solved. There is therefore a need to improve such vertical electromechanical switch devices and methods for manufacturing such devices.

SUMMARY OF CERTAIN INVENTIVE ASPECTS

According to one aspect of the present description, there is provided an electromechanical device comprising: a first electrode stack and a second electrode stack, both electrode stacks extending in a vertical direction relative to a substrate and being spaced apart by a gap; and a third electrode stack comprising a beam extending in a vertical direction in the electrode gap and being spaced apart from the first electrode stack by a first gap, from the second electrode stack by a second gap, and from the substrate by a third gap; and a connector portion overlapping the first and second electrode stacks, wherein, in operation, the beam is movable in a first direction so as to electrically connect with the first electrode stack or in a second direction so as to electrically connect with the second electrode stack, and, in a rest position, the beam is isolated from the first and the second electrode stacks; and wherein at least one of the electrode stacks comprises two electrodes, a top electrode stacked over a bottom electrode and separated therefrom by an electrical insulator.

Advantageously, according to the invention, the electromechanical device separates the beam control gates (the top electrodes) from the beam contact area (the bottom electrodes), which is beneficial for controlling resistance and actuation independently. Additionally, device operation and reliability are improved, particularly in an arrangement structure comprising a plurality of such electromechanical devices. Furthermore, the electromechanical devices according to the invention allow for integration in a dense grid, which is beneficial for memory, power, multiplexing, sensor or actuation circuitry.

According to another exemplary embodiment, both the first and the second electrode stack comprise a top electrode stacked over the bottom electrode and both electrodes are separated by an electrical insulator.

According to another exemplary embodiment, one of the first or second electrode stacks comprises a top electrode stacked over one or two electrical insulators.

According to another exemplary embodiment, the electromechanical device comprises at least a fourth electrode stack extending in a vertical direction relative to the substrate and being spaced apart by another gap from the first or the second electrode stack, and wherein the third electrode stack comprises another beam extending in a vertical direction in said another electrode gap and the connector portion overlapping the first, second and fourth electrode stacks.

According to another exemplary embodiment, the electromechanical device comprises two or more top connectors connected to the connector portion and another bottom connector connected to a main bottom electrode located in the middle electrode stack of the three stack electrodes, and wherein the top electrodes are operated such that the two beams are pulled towards the main bottom electrode to make the current flow between the top connectors and the bottom connector, and such that the two beams are pulled away the main bottom electrode to stop the current flow.

According to another exemplary embodiment, the top and bottom electrodes are conductors comprising at least one material selected from the group: Al, Cu, Ti, TiW, TiN, W, Ni and SiGe.

The description also relates to an electronic, integrated circuit or memory comprising a plurality of electromechanical devices according to any one of the embodiments claimed herein.

The description also relates to a method for manufacturing an electrochemical device comprising: first, depositing a first insulation layer over a connection layer; second, depositing a second insulation layer over the first insulation layer; third, forming at least one via to the underlying connection layer; fourth, filling the at least one via with a bottom electrode layer; fifth, forming a bottom electrode structure and depositing an insulation layer around said bottom electrode structure; sixth, depositing another insulation layer over the bottom electrode structure; seventh, depositing a top electrode layer over the previous insulation layer; eight, forming a top electrode structure and depositing an insulation layer around said top electrode structure; ninth, depositing another insulation layer over the top electrode structure, and opening two contact holes in said deposited insulation layer; tenth, forming a vertical cavity for separating two electrode stacks and depositing another insulation layer; eleventh, partially etching said previously deposited insulation layer; twelfth, depositing a conductor layer; thirteenth, partially etching said deposited conductor layer and etching the underlying insulation layer thereby releasing the conductor layer in the vertical cavity; fourteenth, depositing a further conductor layer; and fifteenth, forming top contact conductors for the control gates and the connector portion.

Certain objects and advantages of various inventive aspects have been described above. It is to be understood that not necessarily all such objects or advantages may be achieved in accordance with any particular embodiment of the invention. Those skilled in the art will recognize that the invention may be embodied or carried out in a manner that achieves or optimizes one advantage or group of advantages without necessarily achieving other objects or advantages as may be taught or suggested herein.

BRIEF DESCRIPTION OF THE DRAWINGS

The above and other aspects will be apparent from the following description and with reference to the non-restrictive example embodiment(s) described hereinafter.

DETAILED DESCRIPTION OF CERTAIN ILLUSTRATIVE EMBODIMENTS

In the following, it should be appreciated that in the description of exemplary embodiments, various features of the invention are sometimes grouped together in a single embodiment, figure, or description thereof for the purpose of streamlining the disclosure and aiding in the understanding of one or more of the various inventive aspects. This is however not to be interpreted as the invention requiring more features than the ones expressly recited in each claim, with each claim standing on its own as a separate embodiment.

Furthermore, while some embodiments described herein include some but not other features included in other embodiments, combinations of features of different embodiments are meant to be within the scope of the invention, and form different embodiments, as would be understood by those skilled in the art.

In the description of the embodiments, numerous specific details are set forth.

However, it is understood that embodiments of the invention may be practiced without these non-essential specific details. In other instances, well-known methods, structures and techniques have not been shown in detail in order not to obscure an understanding of this description.

Figure 1:
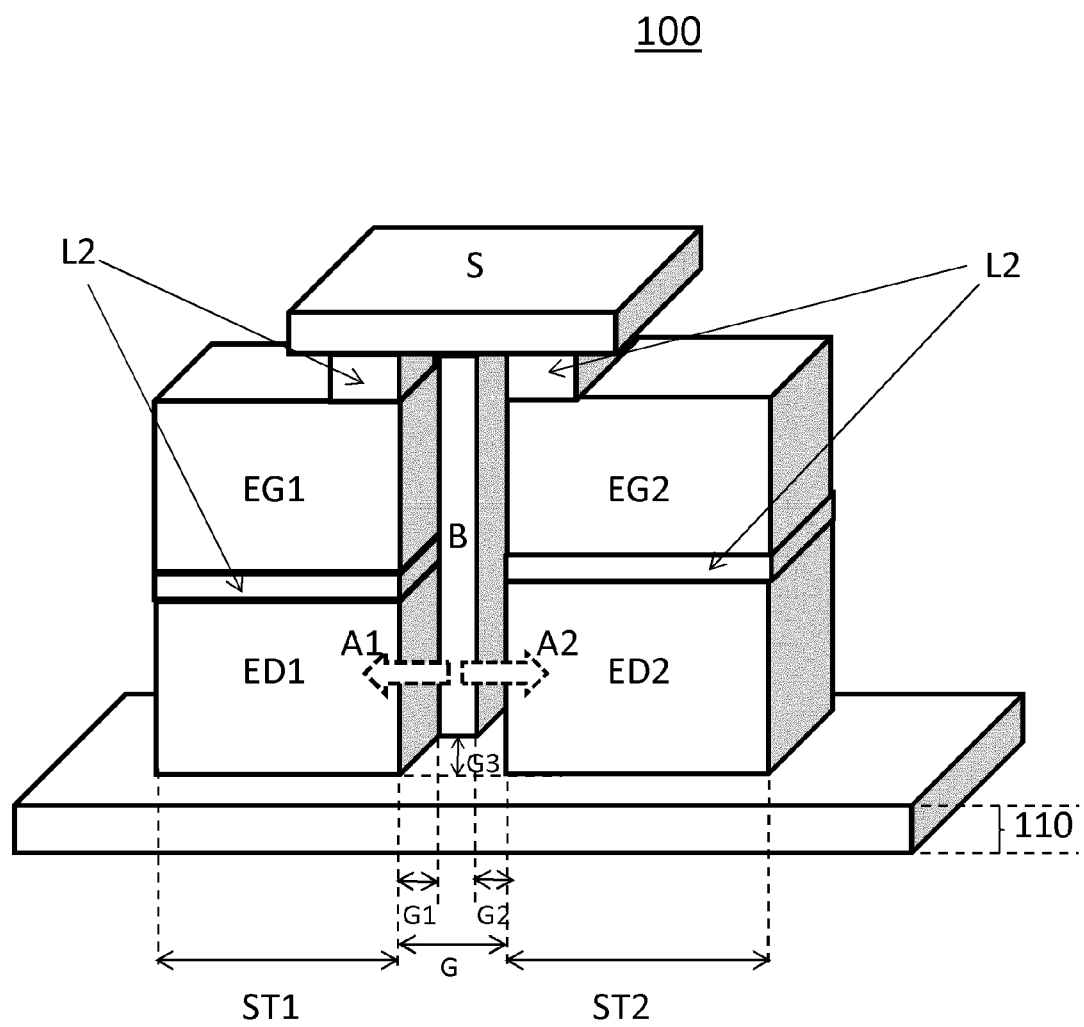
FIG. 1 is a schematic and perspective view of one exemplary embodiment of a vertical electromechanical switch.

FIG. 1 shows a schematic and perspective view of a first exemplary embodiment of a vertical electromechanical switch 100 comprising a first electrode stack ST1 and a second electrode stack ST2 extending in a vertical direction relative to a substrate 110 and spaced apart by a gap G, and a third electrode stack comprising a first portion B and a second portion S, the first portion B extends in a vertical direction in the electrode gap G and is spaced apart from the first electrode stack ST1 by a first gap G1 and from the second electrode stack ST2 by a second gap G2, and the second portion S stands overlapping the first portion B and the first and second electrode stacks ST1, ST2. According to an embodiment of the invention, each one of the electrode stacks ST1, ST2 comprises two electrodes, a first electrode or top electrode EG1, EG2 stacked over a second electrode or bottom electrode ED1, ED2 and separated therefrom by an electrical insulator L2.

In operation, the first portion B or beam can be actuated by the first electrodes EG1, EG2 to move in a first direction A1 so as to electrically connect with a second electrode ED1 in a first position or in a second direction A2 so as to electrically connect with another second electrode ED2 in a second position. In that sense, the first electrodes EG1, EG2 act like control gates in order to move the first beam B of the third electrode stack to contact with any of the bottom electrodes ED1, ED2 which act as drain gates. When the potential difference between the beam B and one of the control gates, for example EG1 of the first electrode stack ST1, is greater than the potential between the beam B and the other control gate, for example EG2 of the second electrode stack ST2, the beam experiences an electrostatic force that moves it in the direction A1 away of the electrode of the second electrode stack ST2. Once a critical value is reached for the potential difference, e.g. the pull-in value, the beam B touches the bottom electrode ED1 of the first electrode stack ST1. On the other hand, when the potential difference between the beam B and one of the control gates, for example EG2 of the second electrode stack ST2, is greater than the potential between the beam B and the other control gate, for example EG1 of the first electrode stack ST1, the beam experiences an electrostatic force that moves it in the direction A2 away of the electrode of the first electrode stack ST1. Once a critical value is reached for the potential difference, e.g. the pull-in value, the beam B touches the bottom electrode ED2 of the second electrode stack ST2. According to an embodiment of the invention, during operation of the switch, the potential difference between the beam B and one of the control gates will be zero and the potential difference between the beam and the other control gate will be larger than the critical pull-in value. Therefore, the beam will be in one of two positions: either connected to the bottom electrode ED1 of the first electrode stack ST1 or connected to the bottom electrode ED2 of the second electrode stack ST2.

According to an embodiment of the invention, the beam B is made of an elastic material and designed to deform, when actuated by the control gates EG1, EG2, in order to electrically connect only with any of the second electrodes ED1, ED2 or drain electrodes. When the beam moves or deforms there is no electrical connection between the third electrode stack and the first electrodes or control gates EG1, EG2.

The substrate 110 may be, for example, a CMOS substrate, the electrical insulation layer L2 may be SiC, the first and second electrodes EG1, EG2, ED1, ED2 may be conductors that can either be etched or formed by damascene processing (e.g. Al, Cu, Ti, TiW, TiN, W, Ni or SiGe). The process flow to create these electrodes, according to an embodiment of the invention, uses vapor HF (VHF) as sacrificial etch method for example Al and SiGe electrodes, and/or another sacrificial layer and/or sacrificial release process (e.g. wet HF in case of TiN) may be needed to avoid attack of an electrode. The third electrode stack S, B may also be a conductor created, for example, either by deposition through Chemical Vapour Deposition or by plating e.g. SiGe, Ni, W, Cu, Pt, etc.

Advantageously, the resulting a lateral footprint for a switch with two control gates EG1, EG2 and two drain electrodes ED1, ED2 can be as small as 12 or 18$F^2$ with F being the minimum feature size of the technology used.

FIGS. 2A and B show, respectively, a cross-sectional and top view of an exemplary embodiment of a vertical electromechanical switch according to FIG. 1 with two conducting bottom electrodes ED1, ED2. The cross-sectional view of FIG. 1A runs across a plane F (in FIG. 1B) which extends vertically relative to the substrate plane.

FIG. 2A shows a CMOS substrate 110 comprising a connection layer CL with circuitry to be connected to the vertical electromechanical switch 100, a first insulation layer L1 of, for example Si-oxide, and a second insulation layer L2 of, for example, SiC.

FIG. 2B shows the second insulation layer L2 and the outer contact conductors CG1, CG2, S configured to operate the top electrodes EG1, EG2 and the third electrode stack S,B respectively.

Figure 2:
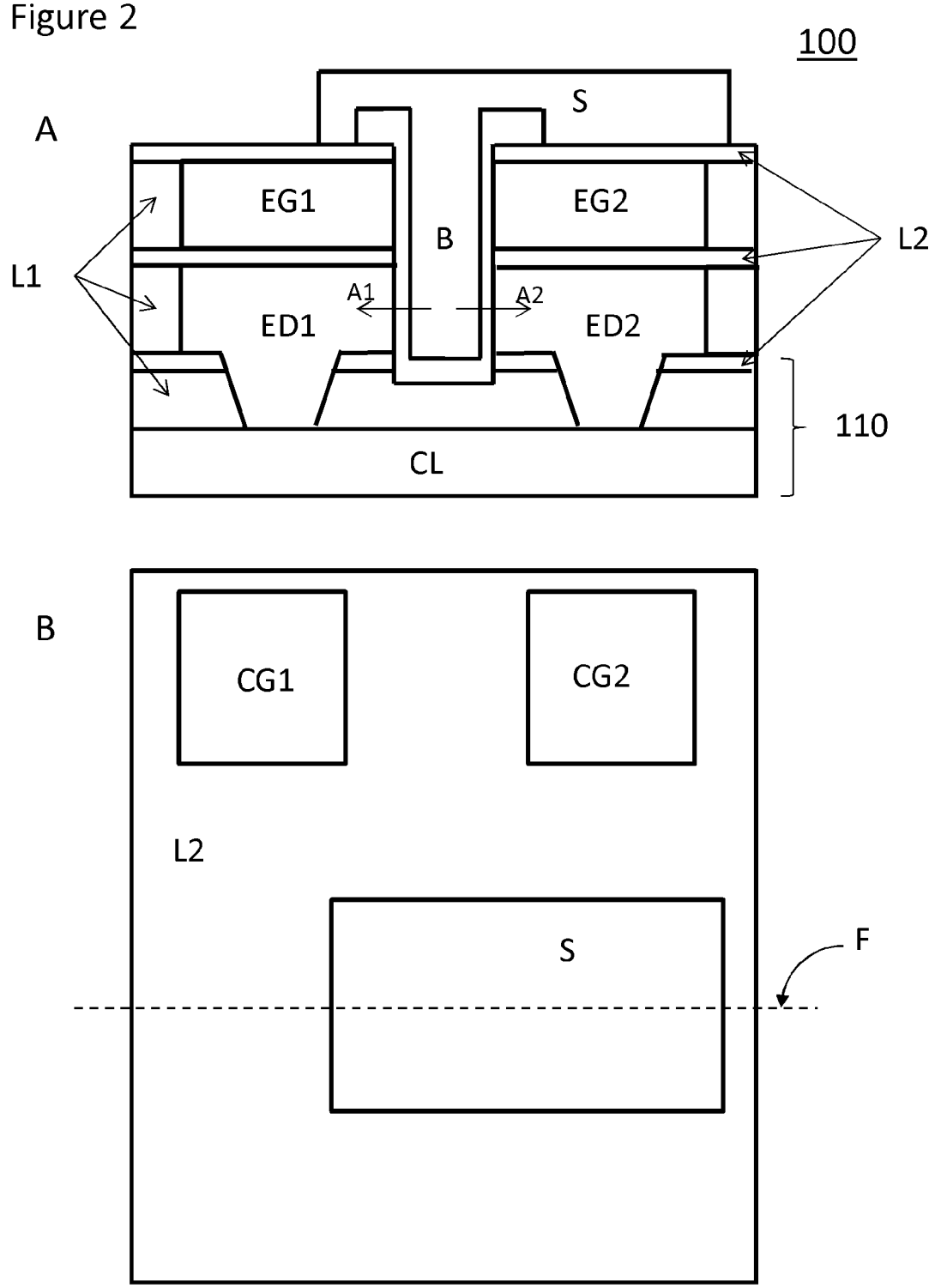
FIGS. 2 A and B show, respectively, a cross-sectional and top view of an exemplary embodiment of a vertical electromechanical switch according to FIG. 1.
Figure 3:
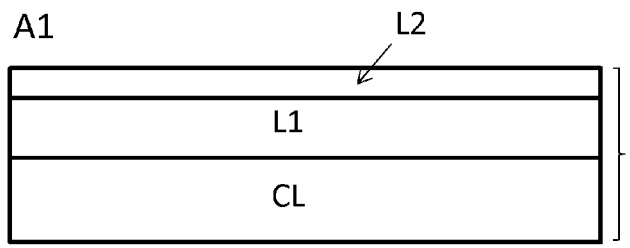
FIGS. 3 A1 to A12 and B1 to B12 show, respectively, a cross-sectional and top view of a plurality of stages for manufacturing an exemplary embodiment of the vertical electromechanical switch according to FIG. 2.
Figure 3:
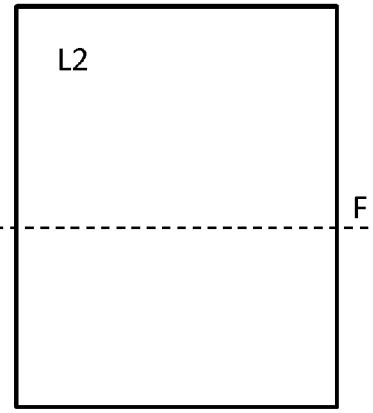
Figure 3:
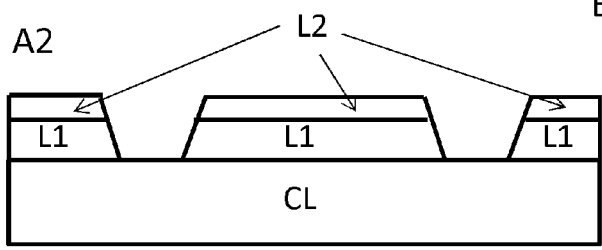
Figure 3:
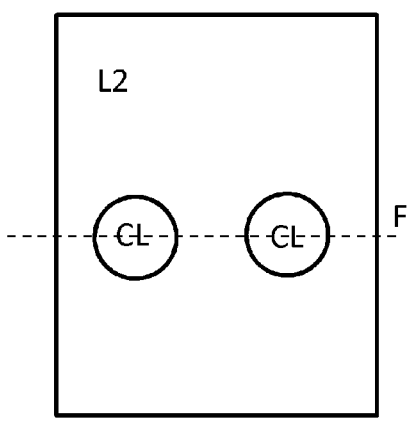
Figure 3:
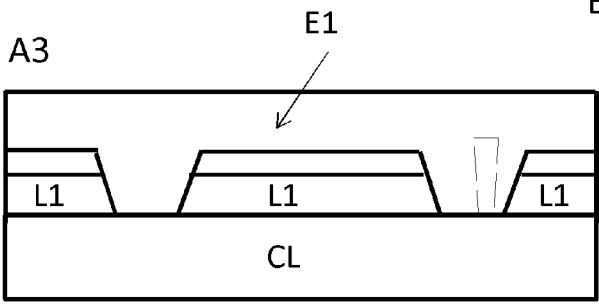
Figure 3:
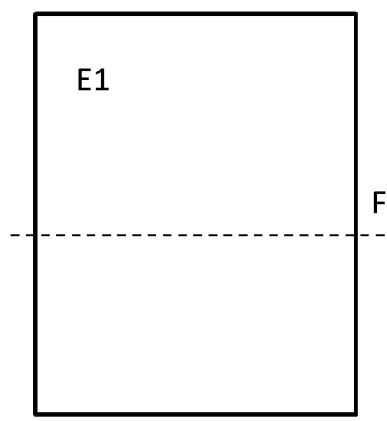
Figure 3:
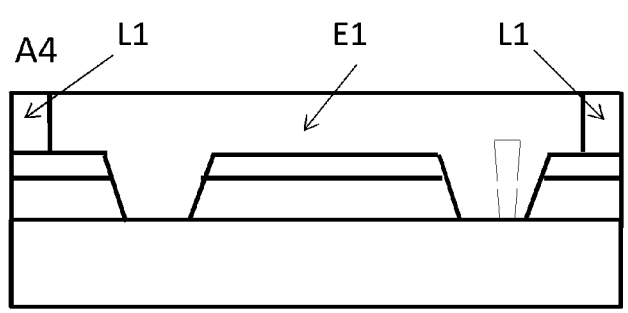
Figure 3:
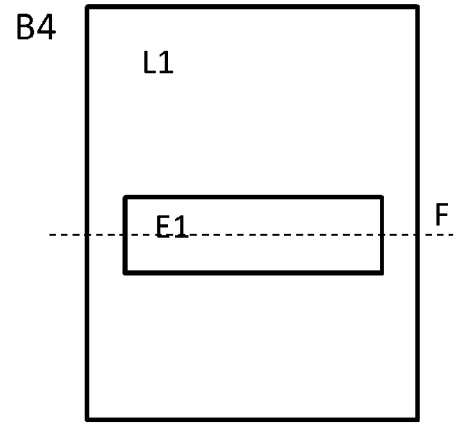
Figure 3:
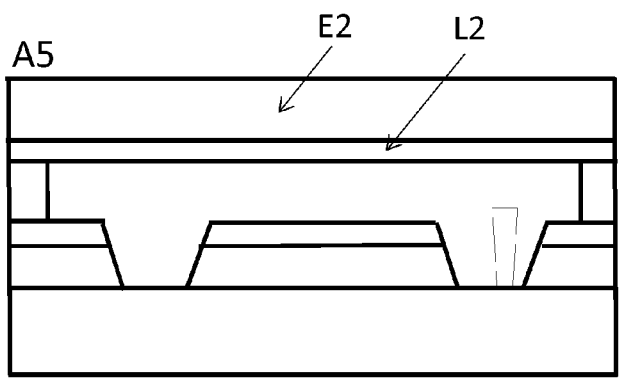
Figure 3:
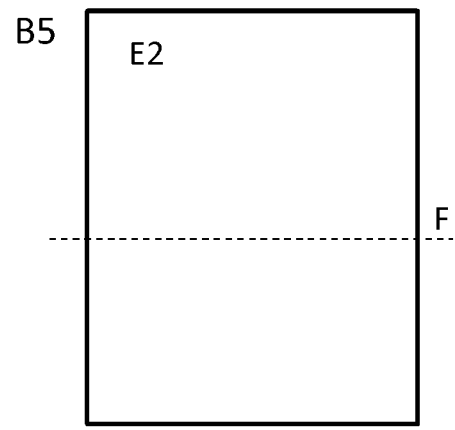
Figure 3:
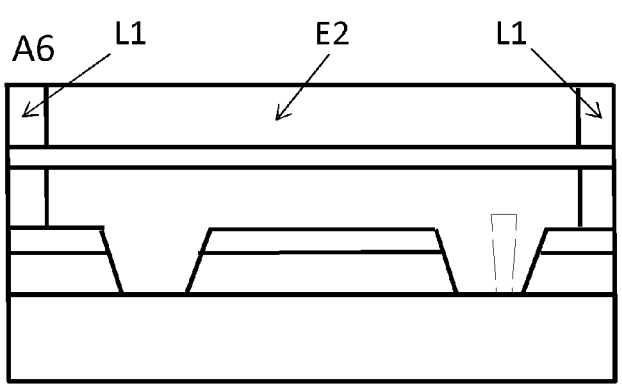
Figure 3:
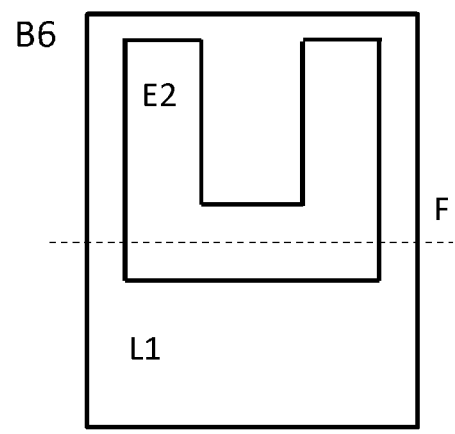
Figure 3:
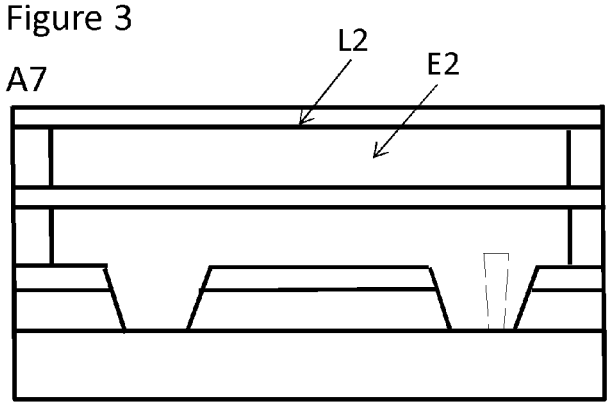
Figure 3:
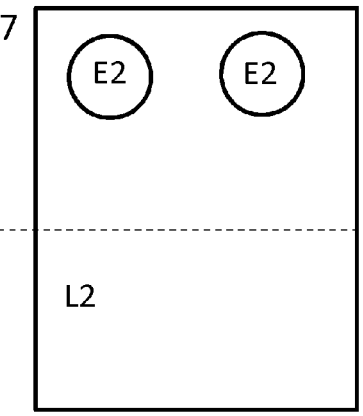
Figure 3:
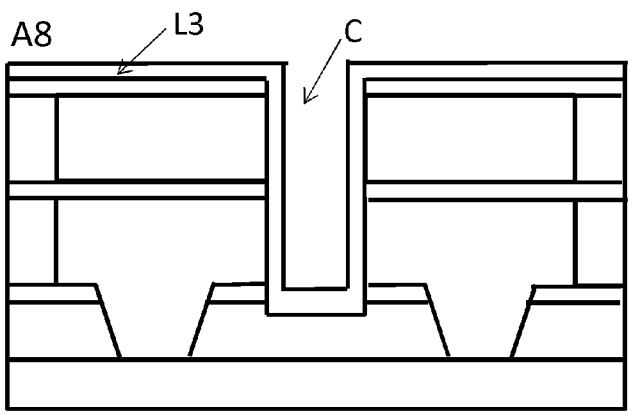
Figure 3:
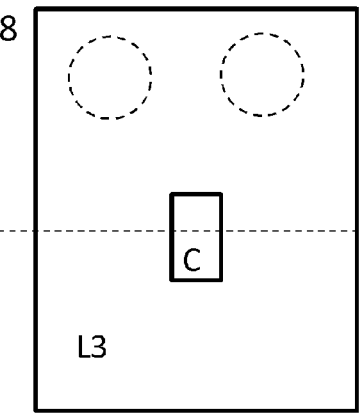
Figure 3:
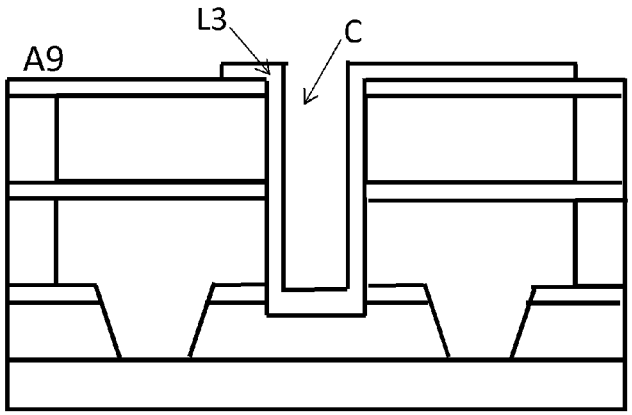
Figure 3:
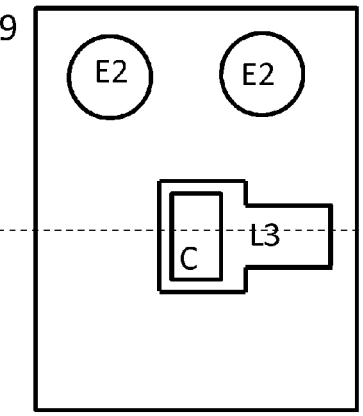
Figure 3:
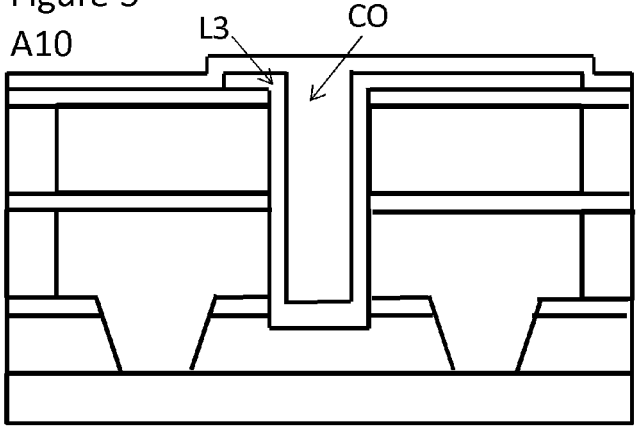
Figure 3:
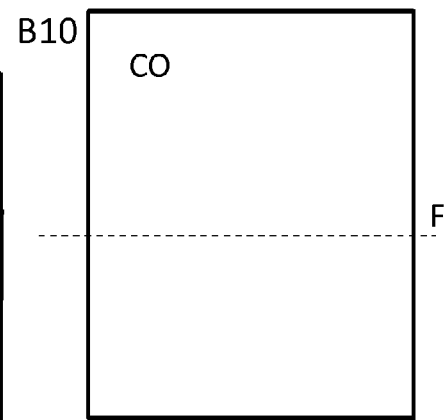
Figure 3:
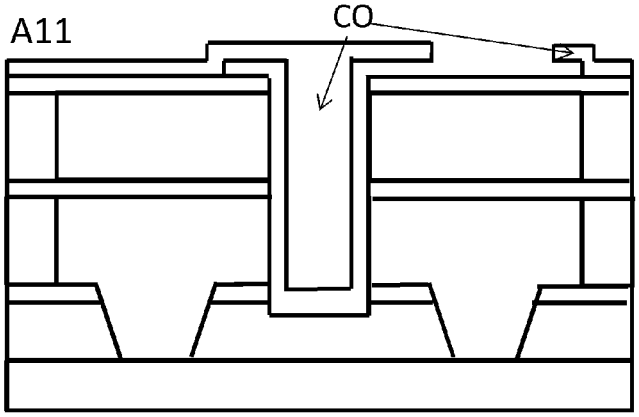
Figure 3:
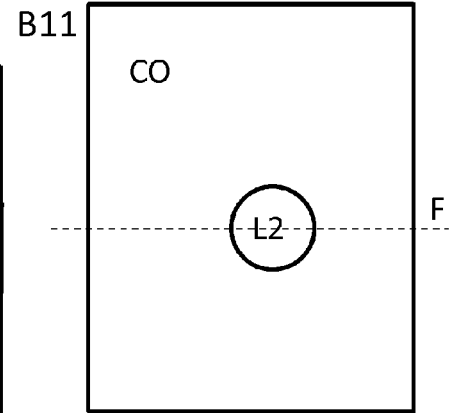
Figure 3:
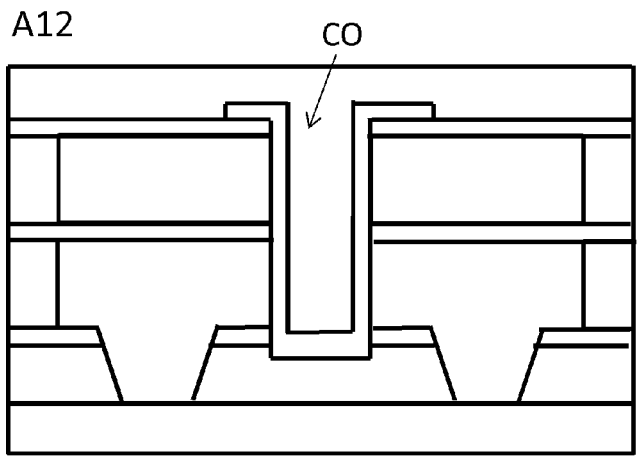
Figure 3:
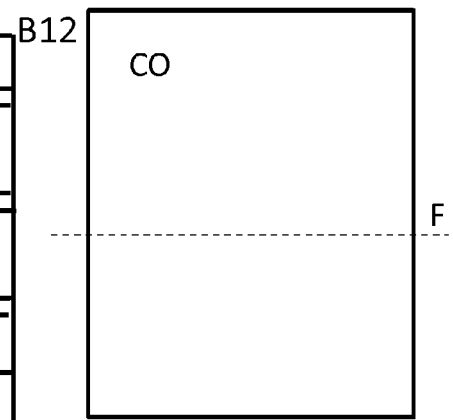

FIGS. 3 A1 to A12 and B1 to B12 show, respectively, a cross-sectional and top view of a plurality of stages for manufacturing an exemplary embodiment of the vertical electromechanical switch according to FIG. 2. The cross-sectional views of FIGS. 3 A1 to A12 run across a plane F (in FIGS. 3 B1 to B12) which extends vertically relative to the substrate plane.

In FIGS. 3 A1 and B1 it is shown a first stage in which the first insulation layer L1 of, for example Si-oxide is deposited over a connection layer CL. Additionally, a second insulation layer L2 of, for example, SiC is deposited over the first insulation layer L1.

In FIGS. 3 A2 and B2 it is shown a second stage in which two vias to the underlying connection layer CL are patterned and etched.

In FIGS. 3 A3 and B3 it is shown a third stage in which the vias are filled with a bottom electrode layer E1 of, for example SiGe. Alternatively, it can be filled with W which is planarized using CMP and then a SiGe electrode is deposited afterwards.

In FIGS. 3 A4 and B4 it is shown a fourth stage in which a lithography patterning and etching of the bottom electrode layer E1 is performed, followed by deposition and planarization, preferably by Chemical Mechanical Polishing, of another first insulation layer L1 of, for example Si-oxide.

In FIGS. 3 A5 and B5 it is shown a fifth stage in which first another second insulation layer L2 of, for example, SiC is deposited over the previous structure, and then a top electrode layer E2 is deposited over the second insulation layer L2.

In FIGS. 3 A6 and B6 it is shown a sixth stage in which the top electrode layer E2 is patterned followed by deposition and planarization, preferably by CMP, of another first insulation layer L1 of, for example Si-oxide.

In FIGS. 3 A7 and B7 it is shown a seventh stage in which a deposition of another second insulation layer L2 of, for example, SiC is performed, followed by opening two contact holes E2 in the second insulation layer L2 for connecting to outside connectors.

In FIGS. 3 A8 and B8 it is shown an eight stage in which the switch cavity trench C or gap G is etched thereby forming the first electrode stack and the second electrode stack. The sidewalls and the bottom of the cavity trench are covered with a third insulation layer L3 of, for example, conformal Si-oxide with a high etch rate in VHF.

In FIGS. 3 A9 and B9 it is shown a ninth stage in which a lithography and etch process of the third insulation layer L3 is performed.

In FIGS. 3 A10 and B10 it is shown a tenth stage in which a conductor layer CO of, for example, CVD SiGe is deposited over the third insulation layer L3 and in the cavity.

In FIGS. 3 A11 and B11 it is shown an eleventh stage in which the third insulation layer L3 is etched by etching a hole on top of the conductor layer CO and then etching with VHF thereby releasing the conductor layer CO in the switch cavity C to form the beam B. Alternatively the third insulation layer L3 may be etched with VHF through a porous thin conductor layer CO.

In FIGS. 3 A12 and B12 it is shown a twelfth stage in which extra conductor layer CO material is deposited to seal the cavity, or alternatively, seal the porous thin conductor layer CO.

In a final stage, as is shown in FIGS. 2 A and B, the conductor layer CO is patterned in order to form the outer contact conductors CG1, CG2, S.

Figure 4:
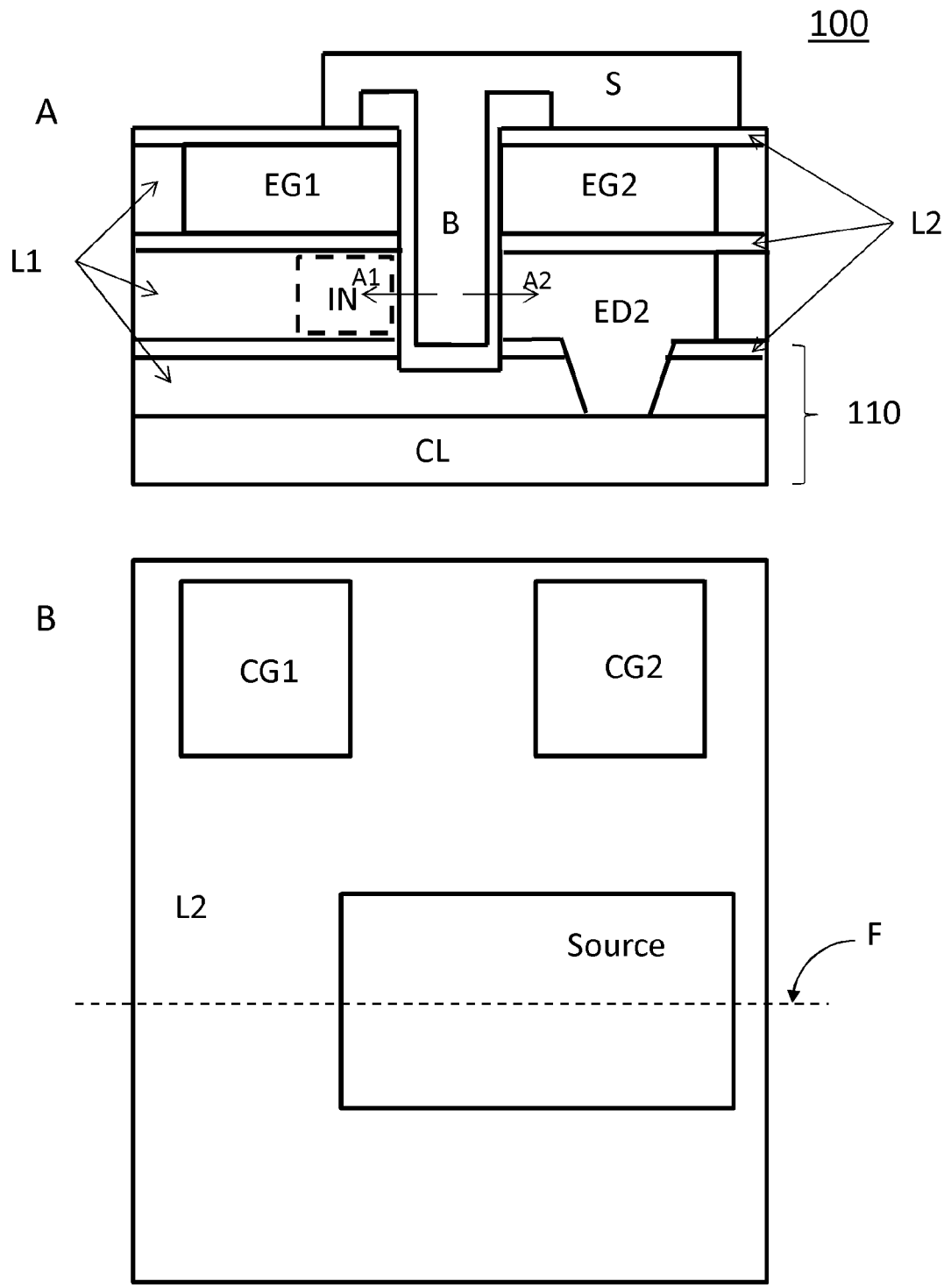
FIGS. 4 A and B show, respectively, a cross-sectional and top view of another exemplary embodiment of a vertical electromechanical switch.

FIGS. 4 A and B show, respectively, a cross-sectional and top view of another exemplary embodiment of a vertical electromechanical switch with one conducting bottom electrode ED2. The cross-sectional view of FIG. 4A runs across a plane F (in FIG. 4B) which extends vertically relative to the substrate plane.

FIG. 4A shows a CMOS substrate 110 comprising a connection layer CL with circuitry to be connected to the vertical electromechanical switch 100, a first insulation layer L1 of, for example Si-oxide, and a second insulation layer L2 of, for example, SiC.

FIG. 4B shows the second insulation layer L2 and the outer contact conductors CG1, CG2, S configured to operate the top electrodes EG1, EG2 and the third electrode stack S, B respectively.

In an embodiment of the invention, one of the electrode stacks, for example the first electrode stack ST1, only comprises a first electrode or top electrode EG1 stacked over two insulator layers L2, L1. In another embodiment, the first insulator layer L1 under the first electrode EG1, in the region that is contacted by the beam B when moved in direction A1, comprises an insulator IN of a different type.

Figure 5:
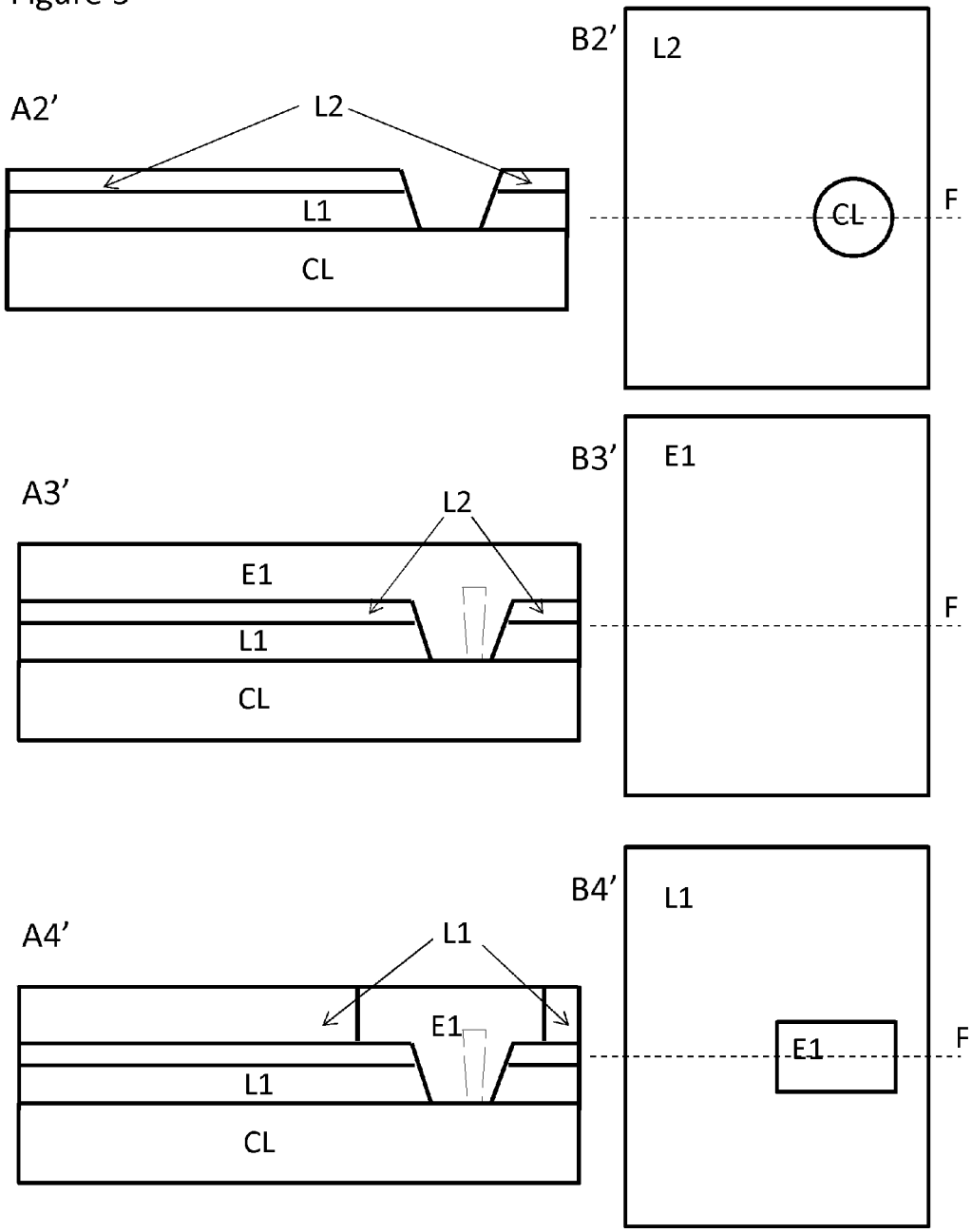
FIGS. 5 A2' to A4' and B2' to B4' show, respectively, a cross-sectional and top view of specific stages for manufacturing an exemplary embodiment of the vertical electromechanical switch according to FIG. 4.

FIGS. 5 A2' to A4' and B2' to B4' show, respectively, a cross-sectional and top view of specific stages for manufacturing an exemplary embodiment of the vertical electromechanical switch according to FIG. 4. The cross-sectional views of FIGS. 5 A2' to A4' run across a plane F (in FIGS. 5 B2' to B4') which extends vertically relative to the substrate plane.

In the example according to FIGS. 5 A2' to A4' and B2' to B4', the process flow presented is directed to the case in which the first insulator layer L1 under the first electrode EG1, is the insulator for contact with the beam B.

It will be apparent that the manufacturing stages for the vertical electromechanical switch shown in FIGS. 4 A and B, are similar to the stages shown for the manufacture of the vertical electromechanical switch shown in FIGS. 2 A and B, but for small differences in the second, third and fourth stages, as will be described below in which only one bottom electrode ED2 is formed.

In FIGS. 5 A2' and B2' it is shown a second stage in which just one via to the underlying connection layer CL is patterned and etched.

In FIGS. 5 A3' and B3' it is shown a third stage in which the via is filled with a bottom electrode layer E1 of, for example SiGe. Alternatively, it can be filled with W which is planarized using CMP and then a SiGe electrode is deposited afterwards.

In FIGS. 5 A4' and B4' it is shown a fourth stage in which a lithography and an etch process of the bottom electrode layer E1 is performed, followed by a by deposition and planarization using CMP of another first insulation layer L1 of, for example Si-oxide.

Figure 6:
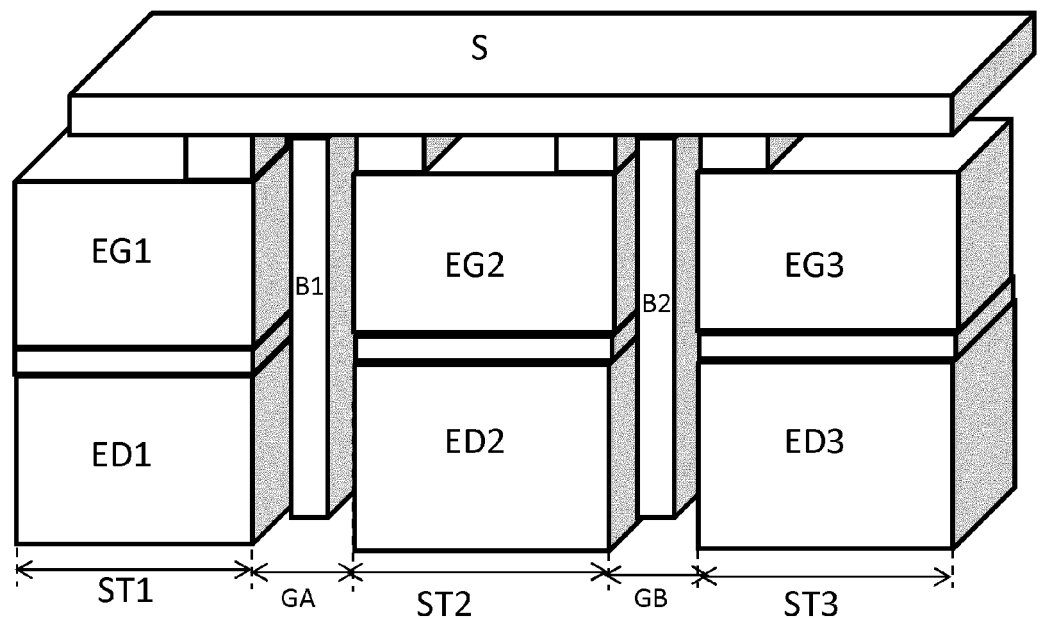
FIG. 6 is a schematic and perspective view of an exemplary embodiment of an arrangement of a plurality of vertical electromechanical switches.

FIG. 6 is a schematic and perspective view of an exemplary embodiment of a first vertical electromechanical switch arrangement 101 of a plurality of vertical electromechanical switches 100 according to the invention, comprising four electrode stacks ST1, ST2, ST3, S, B1 and B2, the first electrode stack ST1 is spaced from the second electrode stack ST2 by a first gap GA and the second electrode stack ST2 is spaced from the third electrode stack ST3 by a second gap GB. The fourth electrode stack comprises a connector portion S overlapping the first, the second and the third electrode stacks and two beams, a first beam B1 vertically extending in the first gap GA and a second beam B2 vertically extending in the second gap GB. According to an embodiment of the invention, both the vertical electromechanical switch 100 and further arrangements with a plurality of vertical electromechanical switches may be used, for example, for memory or power gating applications and/or sensor and/or actuator circuits and/or input/output or multiplexing circuitry.

Figure 7:
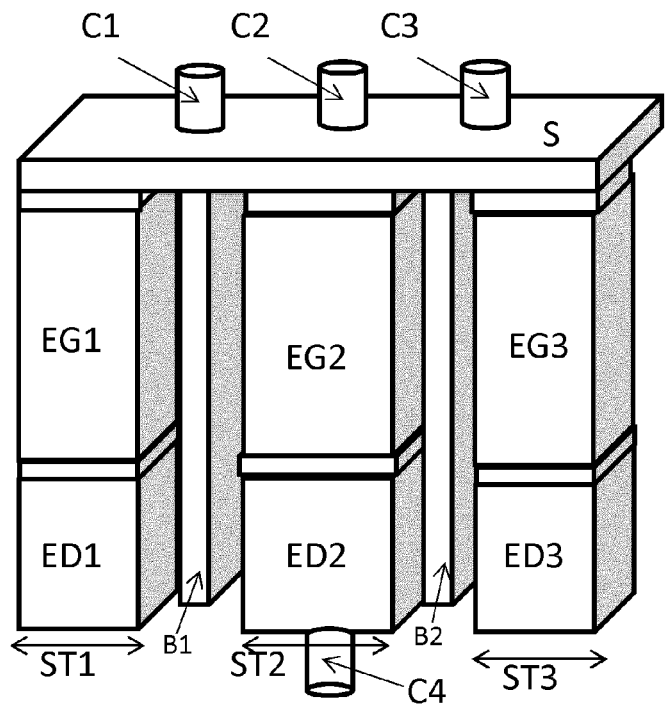
FIG. 7 is a schematic and perspective view of an exemplary embodiment of another arrangement of a plurality of vertical electromechanical switches.

FIG. 7 is a schematic and perspective view of an exemplary embodiment of a second vertical electromechanical switch arrangement 102 of a plurality of vertical electromechanical switches according to the invention. According to an embodiment of the invention, the vertical electromechanical switch arrangement 102 is operated so that the first top electrode EG1 and the third top electrode EG3 have the same voltage, which is opposite to the voltage of the second top electrode EG2, and the first and third bottom electrodes ED1, ED3 are dummy electrodes, i.e. they are electrically isolated and left electrically floating. In operation, when the voltage of the connector portion S is larger than the pull-in voltage and the voltage of the second top electrode EG2 is set to ground, both beams B1, B2 will be pulled to the second bottom electrode ED2 and the current flows between the connectors C1, C2, C3 connected to the connector portion S and the connector C4 connected to the second bottom electrode ED2. When the voltage on the second top electrode EG2 becomes VDD and the voltage on the first and third top electrodes EG1, EG3 becomes ground, the beams B1, B2 will be pulled towards the dummy first and third bottom electrodes ED1, ED3 and the current stops flowing.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electromechanical device comprising:
   a first electrode stack and a second electrode stack, both electrode stacks extending in a vertical direction relative to a substrate surface and being paced apart by a gap;
   a third electrode stack comprising a beam extending in a vertical direction in the electrode gap and being spaced apart from the first electrode stack by a first gap, from the second electrode stack by a second gap, and from the substrate by a third gap; and a connector portion overlapping the first and second electrode stacks, wherein, in operation, the beam is movable in a first direction so as to electrically connect with the first electrode stack or in a second direction so as to electrically connect with the second electrode stack, and, in a rest position, the beam is isolated from the first and the second electrode stacks; and
   a fourth electrode stack extending in a vertical direction relative to the substrate and being spaced apart by another gap from the first or the second electrode stack, and wherein the third electrode stack comprises another beam extending in a vertical direction in said another electrode gap and the connector portion overlapping the first, second and fourth electrode stacks,
   wherein at least one of the first and second electrode stacks comprises two electrodes including a top electrode stacked over a bottom electrode, wherein the top and bottom electrodes are separated by an electrical insulator.

2. The electromechanical device of claim 1, wherein each of the first electrode stack and the second electrode stack comprises a top electrode stacked over a bottom electrode, wherein the top and bottom electrodes are separated by an electrical insulator.

3. The electromechanical device of claim 1, wherein one of the first or second electrode stacks comprises a top electrode stacked over one or two electrical insulators.

4. The electromechanical device of claim 1, further comprising two or more top connectors connected to the connector portion and another bottom connector connected to a main bottom electrode located in the middle electrode stack of the three stack electrodes, and wherein the top electrodes are operated such that the two beams are pulled towards the main bottom electrode to make the current flow between the top connectors and the bottom connector, and such that the two beams are pulled away the main bottom electrode to stop the current flow.

5. The electromechanical device of claim 1, wherein the top and bottom electrodes are conductors comprising at least one material selected from the group consisting of Al, Cu, Ti, TiW, TiN, W, Ni and SiGe.

6. An electronic or integrated circuit comprising a plurality of electromechanical devices according to claim 1.

7. A memory device comprising a plurality of electromechanical devices according to claim 1.

* * * * *